(12) United States Patent
Baba

(10) Patent No.: US 7,364,088 B2
(45) Date of Patent: Apr. 29, 2008

(54) RADIO FREQUENCY IDENTIFICATION TAG

(75) Inventor: Shunji Baba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/295,555

(22) Filed: Dec. 7, 2005

(65) Prior Publication Data

US 2007/0069036 A1    Mar. 29, 2007

(30) Foreign Application Priority Data

Sep. 28, 2005    (JP)    ............................. 2005-281458

(51) Int. Cl.
   *G06K 19/06*    (2006.01)
(52) U.S. Cl. ...................... 235/492; 235/488
(58) Field of Classification Search .............. 235/487, 235/488, 492; 340/572.1, 572.7, 572.8
   See application file for complete search history.

(56) References Cited

U.S. PATENT DOCUMENTS 5,528,222 A * 6/1996 Moskowitz et al. ..... 340/572.7
6,437,985 B1 * 8/2002 Blanc et al. ............... 361/749
2006/0208094 A1 * 9/2006 Ishikawa et al. ............ 235/492

FOREIGN PATENT DOCUMENTS

| JP | 2001-319211 | 11/2001 |
|----|-------------|---------|
| JP | 2003-288576 | 10/2003 |
| JP | 2005-4429   | 1/2005  |
| JP | 2005-4430   | 1/2005  |

* cited by examiner

*Primary Examiner*—Thien M. Le
*Assistant Examiner*—Kumiko C. Koyama
(74) *Attorney, Agent, or Firm*—Kratz, Quintos & Hanson, LLP

(57) ABSTRACT

An RFID tag that includes a base, an antenna for communication wired to the base, a circuit chip electrically connected to the antenna for radio communication via the antenna, a first reinforcing member and a second reinforcing member. The first reinforcing member covers and fills the whole of the circuit chip and part of the antenna. The second reinforcing member is positioned underside of the first reinforcing member across the base and has an edge that is displaced from the edge of the first reinforcing member at least in the point where the edge of the first reinforcing member meets the antenna.

6 Claims, 6 Drawing Sheets

PRIOR ART

RADIO FREQUENCY IDENTIFICATION TAG

BACKGROUND OF THE INVENTION

1. Field of the Invention

The present invention relates to a radio frequency identification (RFID) tag that exchanges information with an external device in a noncontact manner. In some cases, among those skilled in the technical field corresponding to the present invention, the "RFID tag" referred to in this specification is called "RFID tag inlay" as an internal constituent member (inlay) for an "RFID tag." In some other cases, this "RFID tag" is called a "wireless IC tag." Additionally, this "RFID tag" includes a noncontact-type IC card.

2. Description of the Related Art

Recently there have been proposed various types of RFID tags that are capable of performing noncontact information exchange, by means of radio waves, with external devices typified by reader/writers. One of the RFID tags has an antenna pattern for radio wave communication and an IC chip mounted on a base sheet made of a plastic or paper. This type of the RFID tag is intended to be used by attaching the RFID tag to an article to exchange information about the article with an external device for identification or the like of the article.

FIG. 1 is a side view of an example of the conventional RFID tag. The side view shown here is a drawing in which the internal structure is seen through the side-surface side of the RFID tag. In this specification, drawings hereinafter called a side view are all similar drawings.

The RFID tag 1 of FIG. 1 has an antenna 12 on a base 13 formed of a sheet-type material such as a polyethylene terephthalate (PET) film, an IC chip 11 connected to the antenna 12 through bumps (metal projections) 14, and an adhesive 15 for fixing the IC chip 11 to the base 13.

The IC chip constituting the RFID tag 1 can exchange information through radio wave with an external device by means of the antenna 12.

This type of the RFID tag has a potential to be used in wide range of areas including the above-described usage. However, if the RFID tag is used by being attaching to an easy-to-deform article, for example, clothing, bending stress is applied to the IC chip 11 as the IC chip 11 is less flexible than the base 13. As a result, the IC 11 is likely to be broken or peeled off, which poses a problem. In order to reduce bending stress on the IC chip, various techniques have been proposed (see, for example, Japanese Patent Application Publication Nos. 2001-319211, 2003-288576, 2005-4429, and 2005-4430).

For example, two of the conventional techniques to reduce bending stress on the IC chip are shown below.

FIG. 2 shows one example of conventional techniques to reduce bending stress on an IC chip.

A RFID tag 2 of FIG. 2 has a reinforcing member 16. The reinforcing member 16 covers to fill the whole of the IC chip 11 and part of the antenna 12 so as to disperse bending stress in the area where the reinforcing member is placed, thus contributing to reduction in bending stress applied to the IC chip 11.

FIG. 3 shows another example of conventional techniques to further reduce bending stress on an IC chip than the technique shown in FIG. 2.

A RFID tag 3 of FIG. 3 has reinforcing members 16 provided on and beneath the base 13. A reinforcing plate 17, which is harder than the reinforcing member 16, is placed on the surface of each of the reinforcing members 16 in parallel with the base 13. Accordingly, bending stress in the area where the reinforcing members 16 are placed is further reduced, leading to more reduction in bending stress on the IC chip 11.

However, in this type of the RFID tag with the reinforcing member, bending stress tends to concentrate in where the edge of the reinforcing member meets the antenna and, thus, is likely to cause disconnection of the antenna.

SUMMARY OF THE INVENTION

The present invention has been made in view of the above circumstances, and provides a RFID tag that reduces bending stress intensively applied to an IC chip and also prevents disconnection of an antenna.

The RFID tag of the present invention includes:

a base;

an antenna for communication wired to the base;

a circuit chip electrically connected to the antenna for radio communication via the antenna;

a first reinforcing member covering and filling the whole of the circuit chip and part of the antenna; and a second reinforcing member positioned at the underside of the first reinforcing member across the base, the second reinforcing member having an edge that is displaced from the edge of the first reinforcing member at least in the point where the edge of the first reinforcing member meets the antenna.

According to the RFID tag of the invention, the edge of the second reinforcing member is displaced from that of the first reinforcing member at the position where the edge of the first reinforcing member meets the antenna. Accordingly, bending stress is dispersed across the displacement and bending stress on the antenna is reduced and, therefore, disconnection of the antenna is prevented. Additionally, as the second reinforcing member is disposed at the underside of the first reinforcing member across the base, bending stress on the circuit chip is greatly reduced compared to the case in which a reinforcing member is disposed only at a single side of the base. Therefore, breaking and peeling off of the circuit chip is prevented.

Preferably, according to the RFID tag of the invention, the second reinforcing member is displaced from the position exactly beneath the first reinforcing member across the base, so that the edge of the second reinforcing member is displaced from the edge of the first reinforcing member. It is also preferable that the second reinforcing member has a different size or shape from the first reinforcing member, so that the edge of the second reinforcing member is displaced from the edge of the first reinforcing member. Additionally, the second reinforcing member may be disposed in a different direction from the first reinforcing member, so that the edge of the second reinforcing member is displaced from the edge of the first reinforcing member.

If the second reinforcing member is disposed so as to be displaced from the edge of the first reinforcing member at the point where the edge of the first reinforcing member meets the antenna, bending stress on the antenna applied to the point where the first reinforcing member meets the antenna is reduced. Accordingly, a failure, for example, disconnection of the antenna is avoided. Because the second reinforcing member is different from the first reinforcing member in its position, size, shape or direction, disconnection of the antenna is prevented.

Additionally, the RFID tag may have a reinforcing plate which sandwiches at least one of the first reinforcing member and the second reinforcing member between the base and the reinforcing plate, the reinforcing plate being harder than the one of the first reinforcing member and the second reinforcing member.

By providing the reinforcing plate harder than the reinforcing member, bending stress is dispersed and therefore bending stress on the circuit chip is further reduced.

As described above, the RFID tag according to the invention reduces bending stress focused on the circuit chip and prevents disconnection of the antenna.

DETAILED DESCRIPTION OF THE INVENTION

Embodiments of the present invention will be described below with reference to the attached drawings.

Figure 1:
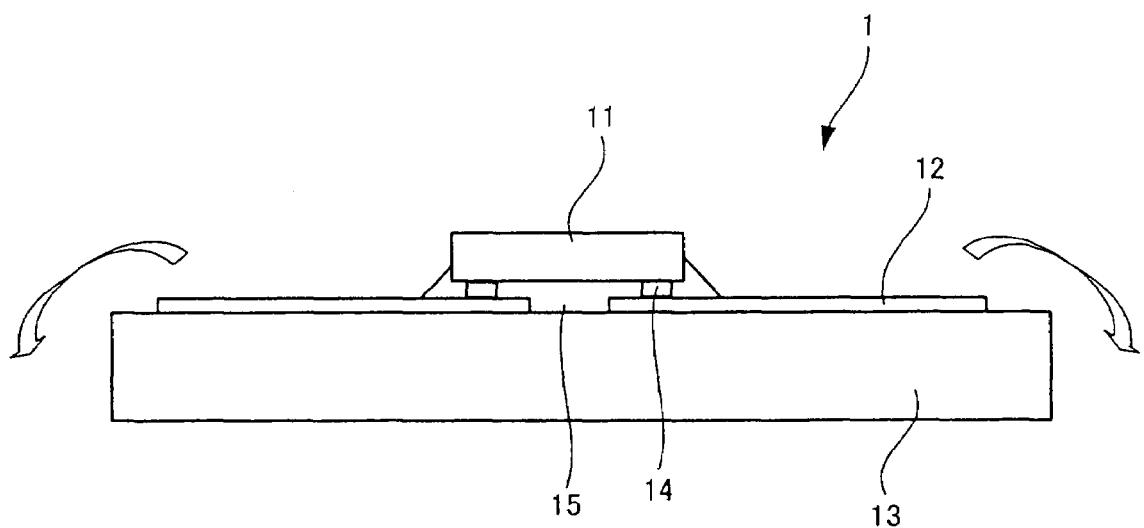
FIG. 1 is a side view showing one example of a RFID tag.
Figure 2:
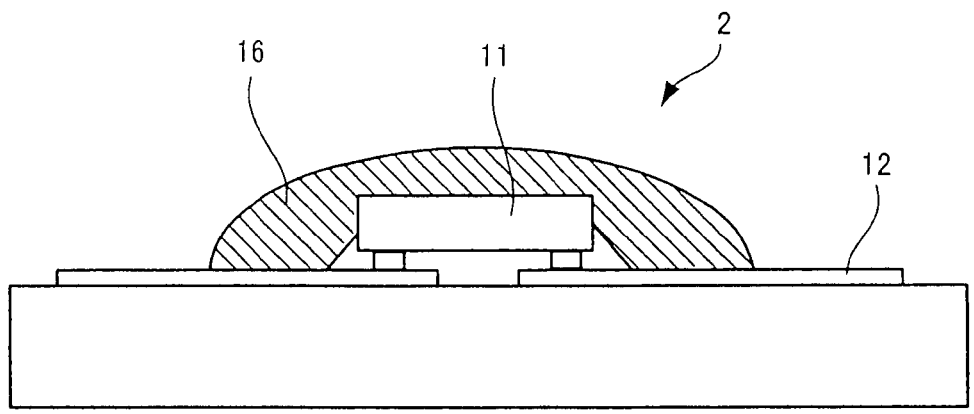
FIG. 2 illustrates one example of conventional techniques to reduce bending stress on an IC chip.
Figure 3:
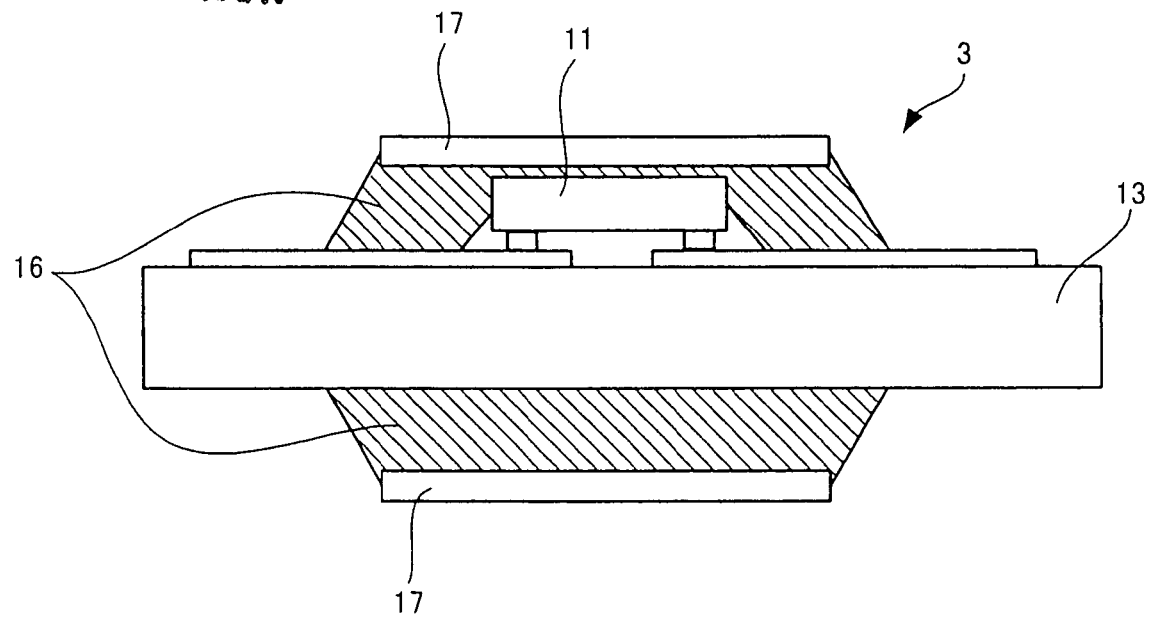
FIG. 3 is another example of conventional techniques to further reduce bending stress on an IC chip compared to FIG. 2.
Figure 4:
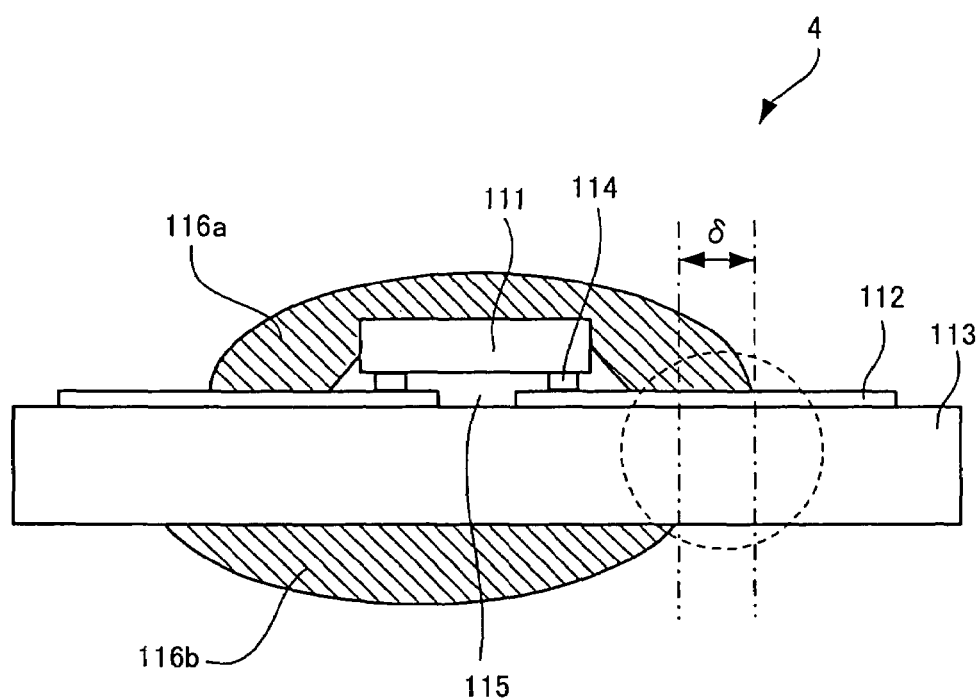
FIG. 4 is a side view of a RFID tag according to a first embodiment of the present invention.

A RFID tag 4 of FIG. 4 is constituted by a base 113 made of sheet-type PET film, an antenna 112 formed of a copper film and provided on the base 113, an IC chip 111 connected to the antenna 112 by means of bumps 114, an adhesive 115 for fixing the IC chip 111 to the base 113, a first reinforcing member 116a made of epoxy resin for covering and filling the whole of the IC 111 and part of the antenna 112, and a second reinforcing member 116b made of the same material as the first reinforcing member 116a that is positioned at the underside of the first reinforcing member 116a across the base 113.

Apart from PET film, the base 113 may be made from, for example, other polyester resin such as noncrystal polyester resin (PET-G), chloroethylene, acrylonitrile-butadiene-styrene (ABS), cellulosic resin, polyvinyl acetate, polystyrene resin and polyolefin resin. Additionally, the antenna 112 may be formed from, for example, a film of other metal such as aluminum, iron and nickel, or paste material with conductivity attached by adding metallic filler (in ordinary cases, Ag) to resin material such as epoxy.

The first reinforcing member 116a and the second reinforcing member 116b that are formed from thermosetting resin are placed in the position as shown in FIG. 4 in their fluid state and then are hardened by heating. As shown in the figure, the edge of the first reinforcing member 116a is displaced from the edge of the second reinforcing member 116b by a distance 6 at the point where the edge of the first reinforcing member 116a meets the antenna 112.

Figure 5:
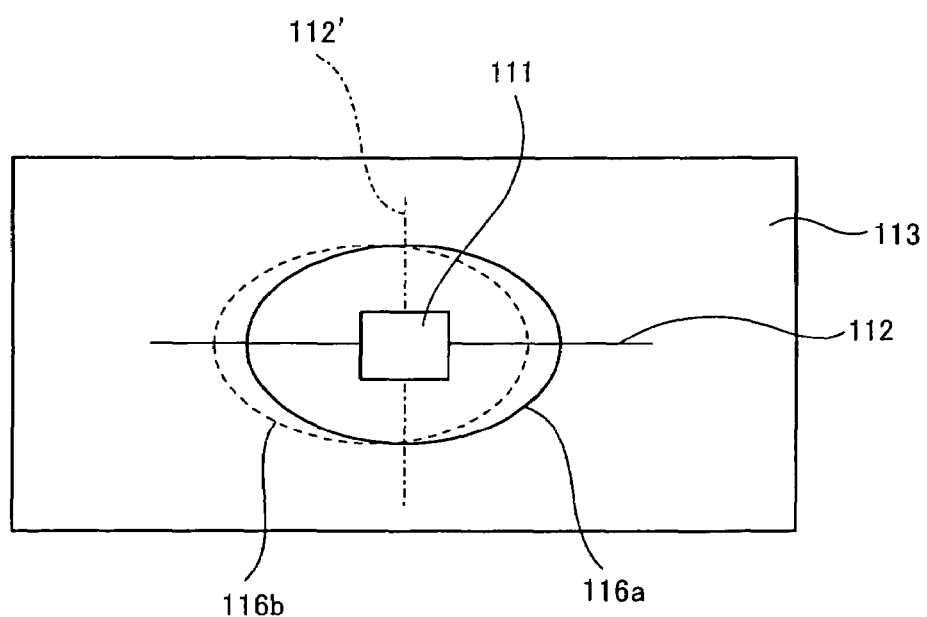
FIG. 5 is a top view of the RFID tag shown in FIG. 4.

FIG. 5 is a top view of the RFID tag 4 shown in FIG. 4.

As shown in FIG. 5, the first reinforcing member 116a and the second reinforcing member 116b are oval having the same size, form, and direction. However, the second reinforcing member 116b is not positioned exactly beneath the first reinforcing member, but is positioned such that the edge of the second reinforcing member 116b is displaced the maximum distance with respect to the edge of the first reinforcing member 116a at the point where the edge of the first reinforcing member 116a meets the antenna 112.

As shown in FIGS. 4 and 5, the presence of reinforcing members are disposed on and under the base 113, which disperses bending stress in the area where the reinforcing members are placed, and thus prevents the IC chip 111 from being broken and peeling off. Further, as the edge of the second reinforcing member 116b is displaced from the edge of the first reinforcing member 116a at the point where the edge of the first reinforcing member 116a meets the antenna 112, bending force is dispersed across the entire width of the displacement. Accordingly, bending force focused on part of the antenna 112 is reduced and a failure, for example, disconnection of the antenna 112 is avoided. If it is assumed that an antenna 112' is placed at the position where the edges of the second reinforcing member 116b meet the edges of the first reinforcing member 116a, bending stress would focus on part of the antenna 112' to cause disconnection of the antenna 112'. That is why the reinforcing members should be displaced from each other at the point where the edge of one of reinforcing members meets the antenna. Preferably, the first reinforcing member 116a and the second reinforcing member 116b are made from the same amount of material in order to prevent a failure, for example, deformation of a RFID tag when thermosetting resin constituting the reinforcing members is heat-hardened.

Now, the second embodiment through the fifth embodiment will be described below. The second through fourth embodiments are different from the first embodiments in the shape of the reinforcing members, and the fifth embodiment is different from the first embodiment in the surface structure of the reinforcing members.

Elements of the second through the fifth embodiments that are identical to elements of the first embodiment will not be described further herein.

Figure 6:
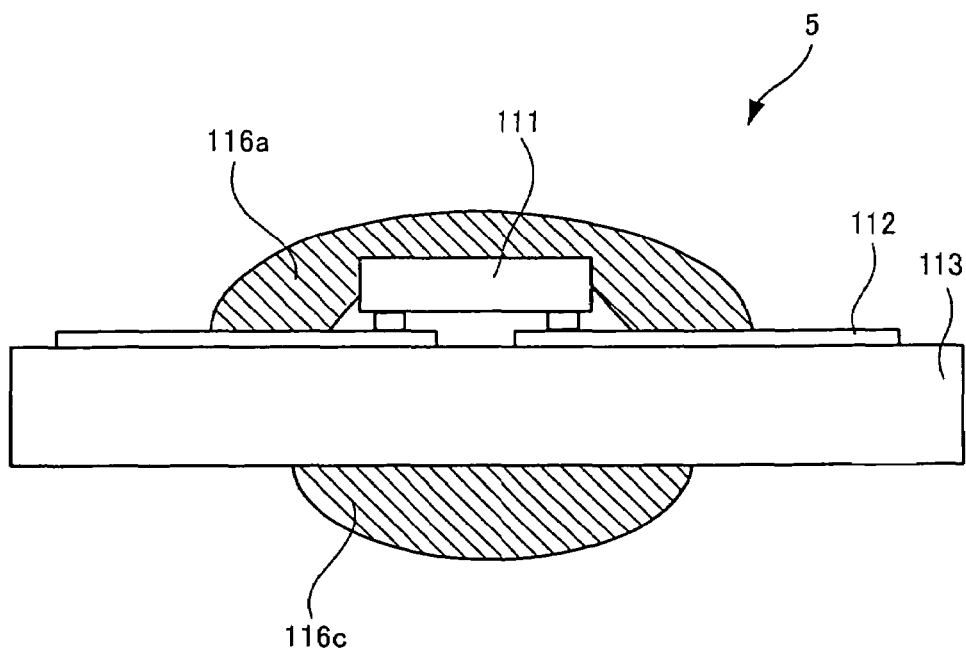
FIG. 6 is a side view of a RFID tag according to a second embodiment.
Figure 7:
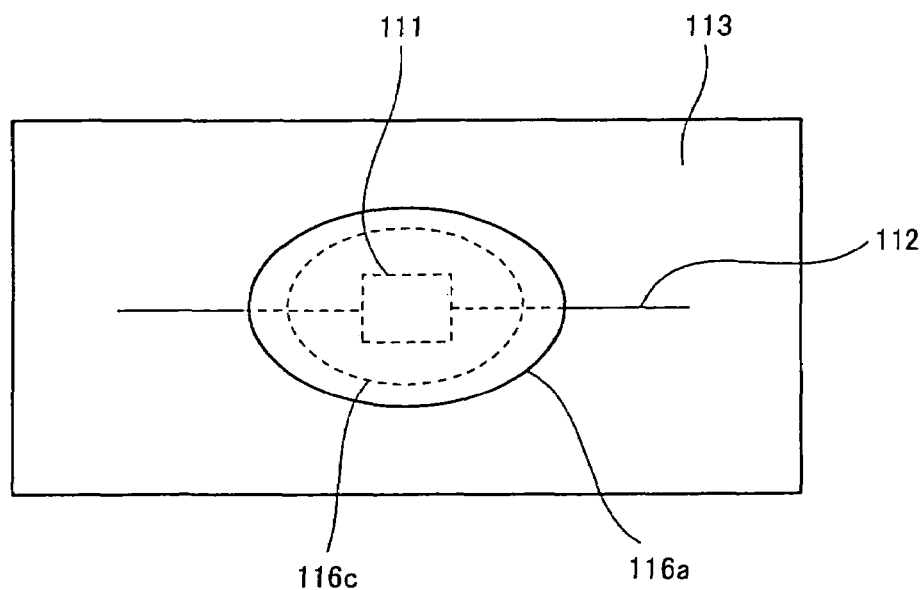
FIG. 7 is a top view of the RFID tag shown in FIG. 6.

FIG. 6 shows a side view of a RFID tag 5 according to the second embodiment, and FIG. 7 is a top view of the RFID tag 5 shown in FIG. 6.

FIGS. 6 and 7 show the RFID tag 5 that has the first reinforcing member 116a, similar to the first embodiment, and a second reinforcing member 116c made of the same material as the first reinforcing member 116a and positioned at the underside of the first reinforcing member 116a across the base 113. The second reinforcing member 116c is oval having the same shape and facing the same direction as first reinforcing member 116a, but is smaller than the first reinforcing member 116a. Accordingly, the edge of the second reinforcing member 116c is displaced across its entire periphery from the first reinforcing member 116a. Therefore, irrespective of a direction that the antenna 112 is positioned, the edge of the second reinforcing member 116c is unfailingly displaced with respect to the edge of the first reinforcing member 116a at the point where the edge of the first reinforcing member 116a meets the antenna 112. Thus, bending force is dispersed across the entire width of displacement, reducing bending stress on the antenna 112. Consequently, the RFID tag according to the second embodiment can also prevent a failure, for example, disconnection of the antenna 112.

Figure 8:
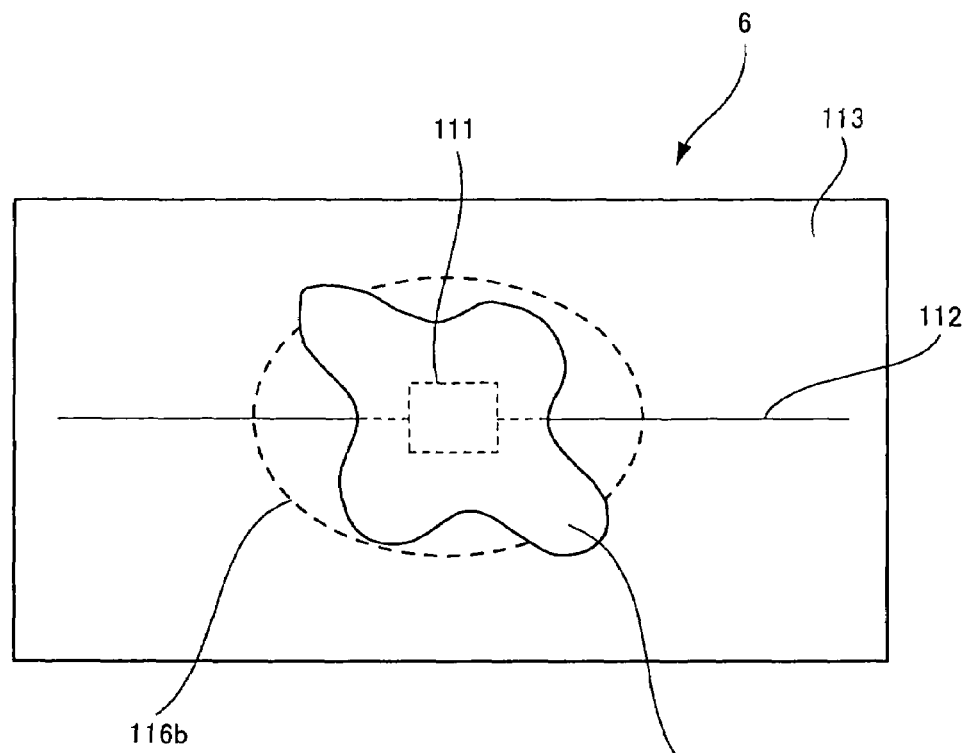
FIG. 8 is a top view of a RFID tag according to a third embodiment.

FIG. 8 shows a top view of a RFID tag 6 according to the third embodiment.

The RFID tag 6 of FIG. 8 has a first reinforcing member 116d and the second reinforcing member 116b. The first reinforcing member 116d, which is formed of epoxy resin and covers to fill the whole of the IC chip 111 and part of the antenna 112, has four projections. The second reinforcing member 116b is oval, similarly to FIG. 4, positioned at the underside of the first reinforcing member 116d and formed of the same material as the first reinforcing member 116d. Accordingly, the difference between the third embodiment and the first embodiment is the difference in shape between the first reinforcing member and the second reinforcing member.

As shown in FIG. 8, the edge of the first reinforcing member 116d is largely displaced from that of the second reinforcing member 116b because the edge of the first reinforcing member 116d meets the antenna 112 at its depression. Accordingly, bending stress is dispersed across the width of the large displacement, reducing bending stress on the antenna 112. Therefore, the RFID tag 6 according to the third embodiment can also prevent a failure, for example, disconnection of the antenna 112.

Figure 9:
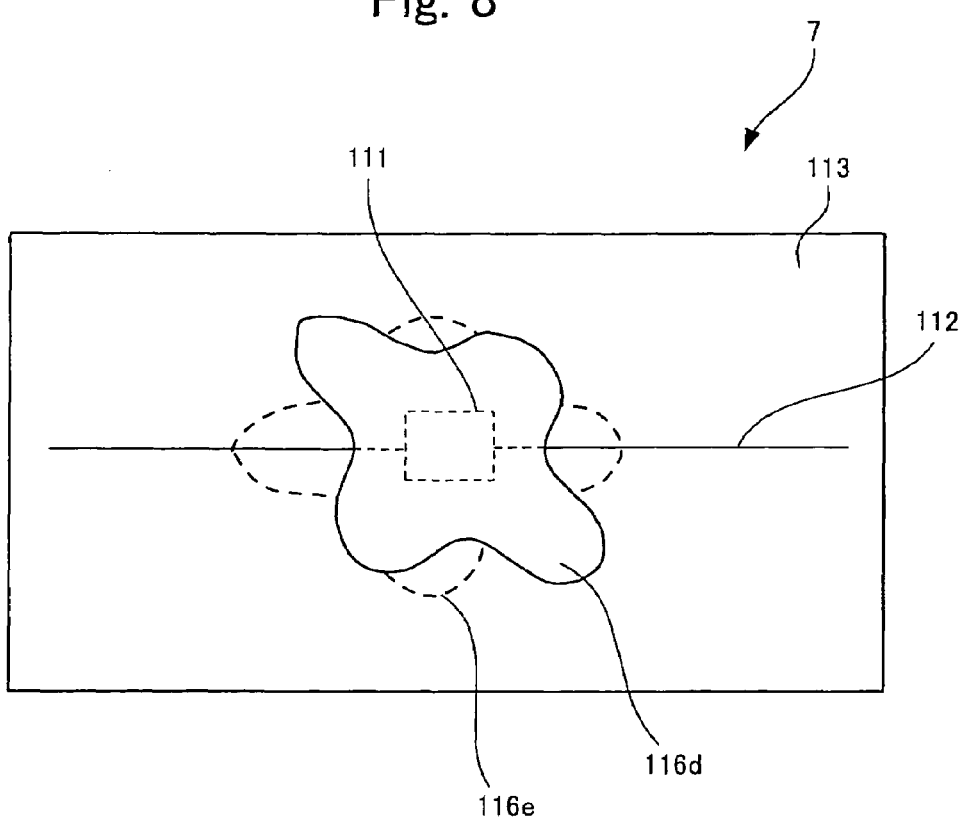
FIG. 9 is a top view of a RFID tag according to a fourth embodiment.

FIG. 9 shows a RFID tag 7 according to the fourth embodiment.

The RFID tag 7 of FIG. 9 has the first reinforcing member 116d having four projections similar to FIG. 8 and a second reinforcing member 116e. The second reinforcing member 116e is in the same shape, formed of the same material as the first reinforcing member 116d and positioned at the underside of the first reinforcing member 116d across the base 113. The first reinforcing member 116d and the second reinforcing member 116e are positioned such that their projections are displaced with respect to each other. Accordingly, the difference between the fourth embodiment and the first embodiment is the difference in the direction between the first reinforcing member and the second reinforcing member.

As shown in FIG. 9, the edge of the first reinforcing member 116d is largely displaced from that of the second reinforcing member 116b because the edge of the first reinforcing member 116d meets the antenna 112 at its depression which corresponds to the projection of the second reinforcing member 116e. Accordingly, bending stress is dispersed across the width of the large displacement, reducing bending stress focused on part of the antenna 112. Therefore, the RFID tag 7 of the fourth embodiment can prevent a failure, for example, disconnection of the antenna 112.

Figure 10:
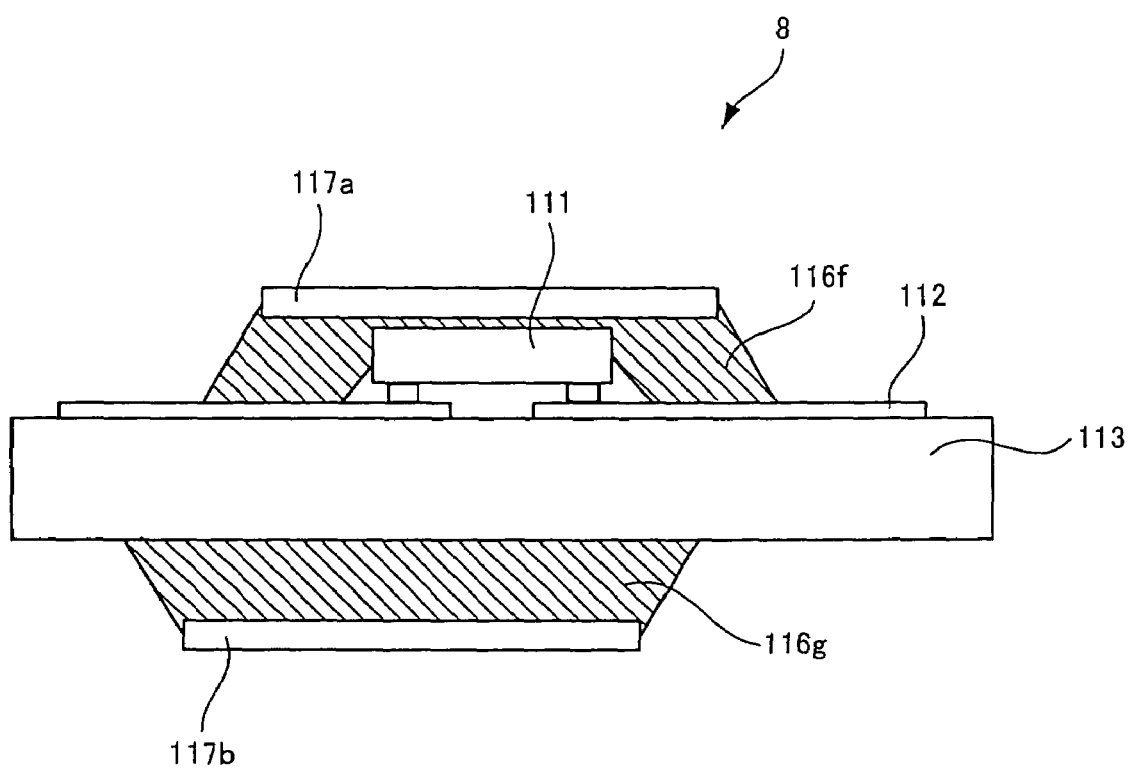
FIG. 10 is a side view of a RFID tag according to a fifth embodiment.

FIG. 10 is a side view of a RFID tag 8 according to the fifth embodiment.

The RFID tag 8 of FIG. 10 has a first reinforcing member 116f that covers to fill the whole of the IC chip 111 and part of the antenna 112, and a second reinforcing member 116g. The second reinforcing member 116g is formed of the same material as the first reinforcing member 116f and positioned at the underside of the first reinforcing member 116f across the base 113. Additionally, the first reinforcing member 116f and the second reinforcing member 116g respectively have, on each surface thereof, a first reinforcing plate 117a and a second reinforcing plate 117b that are both formed of stainless steel. According to the fifth embodiment, the first reinforcing plate 117a and the second reinforcing plate 117b are placed parallel to the base 113. Similarly to FIG. 4, the edge of the first reinforcing member 116f is displaced from that of the second reinforcing member 116g at the point where the edge of the first reinforcing member 116f meets the antenna 112. Therefore, the difference between the fifth embodiment and the first embodiment is the presence of the reinforcing plate disposed on each surface of the reinforcing members that is harder than the reinforcing members.

As shown in FIG. 10, the reinforcing members are disposed on and under the base 113, so that bending stress is dispersed and thus the IC chip can be prevented from being broken and peeling off. Furthermore the presence of the reinforcing plates on the reinforcing members ensures prevention of such a failure. Also, the edge of the first reinforcing member 116f is displaced from that of the second reinforcing member 116g at the point where the edge of the first reinforcing member 116f meets the antenna 112. Accordingly, bending stress is dispersed across the width of the displacement, reducing bending stress focused on part of the antenna 112. Therefore, the RFID tag of the fifth embodiment can prevent a failure, for example, disconnection of the antenna 112. Also in the second through the fourth embodiments, the reinforcing plates may be provided on each surface of the reinforcing members.

As described above, the first reinforcing member and the second reinforcing member according to the first through the fifth embodiments are different from each other in their position, size, shape, or direction. However, since in all the embodiments the reinforcing members are disposed on and under the base, bending stress on the IC chip is dispersed and therefore breaking and peeling off of the IC chip can be prevented. Additionally, by placing the reinforcing plate, which is harder than the reinforcing member, on the surface of the reinforcing members, prevention of breaking or peeling off of the IC chip is further ensured. Further, by differentiating the reinforcing members in at least one of position, size, shape and direction, the edge of one of the reinforcing member is displaced from that of the other reinforcing member at the point where the edge of the one of the reinforcing member meets the antenna, thus reducing bending stress on the antenna. This avoids a failure, for example, disconnection of the antenna.

In the above description, the first reinforcing member and the second reinforcing member of the RFID tag according to the first through the fifth embodiment are made from identical materials such as epoxy resin. However, the first reinforcing member and the second reinforcing member may be made from different materials each other such as silicon resin, phenol resin, polyimide resin, acrylic resin and urethane resin. Additionally, in the above description, the first and the second reinforcing members are made from thermosetting resin, but may be made from ultraviolet hardening-type resin according to the invention.

Further in the above description, the first and the second reinforcing plates are made from stainless steel. However, as long as they are harder than the reinforcing members, the first reinforcing plate and the second reinforcing plate may be made from different materials each other such as titanium plate or resin substrate with resin infiltrated into aramid or glass fiber.

Also, in the above description, each of the reinforcing plates is disposed on the surface of the respective reinforcing member in parallel with the base. However, in the RFID tag according to the invention, the reinforcing plate may be disposed inside the reinforcing member, or slightly slant relative to the base, or may be disposed only in one of the reinforcing members.

Further in the above description, the second reinforcing member 116c disposed beneath the IC chip across the base is smaller than the first reinforcing member 116a. However, the second reinforcing member 116c may be larger than the first reinforcing member 116a according to the invention.

What is claimed is:

1. A RFID tag comprising:
    a base;
    an antenna for communication wired to the base;
    a circuit chip electrically connected to the antenna for radio communication via the antenna;
    a first reinforcing member covering and filling the whole of the circuit chip and part of the antenna; and
    a second reinforcing member positioned at the underside of the first reinforcing member across the base, the second reinforcing member having an edge that is situated beneath the first reinforcing member and not beneath areas of the base not covered by the first reinforcing member and displaced from the edge of the first reinforcing member at least in the point where the edge of the first reinforcing member meets the antenna.

2. The RFID tag according to claim 1, wherein the second reinforcing member is displaced from the position exactly beneath the first reinforcing member across the base, so that the edge of the second reinforcing member is displaced from the edge of the first reinforcing member.

3. The RFID tag according to claim 1, wherein the second reinforcing member has a different size from the first reinforcing member, so that the edge of the second reinforcing member is displaced from the edge of the first reinforcing member.

4. The RFID tag according to claim 1, wherein the second reinforcing member has a different shape from the first reinforcing member, so that the edge of the second reinforcing member is displaced from the edge of the first reinforcing member.

5. The RFID tag according to claim 1, wherein the second reinforcing member is disposed in a different direction from the first reinforcing member, so that the edge of the second reinforcing member is displaced from the edge of the first reinforcing member.

6. The RFID tag according to claim 1, including a reinforcing plate which sandwiches at least one of the first reinforcing member and the second reinforcing member between the base and the reinforcing plate, the reinforcing plate being harder than the one of the first reinforcing member and the second reinforcing member.

* * * * *